United States Patent
Sohn et al.

(10) Patent No.: US 12,068,177 B2
(45) Date of Patent: Aug. 20, 2024

(54) RAPID THERMAL PROCESSING SYSTEM WITH COOLING SYSTEM

(71) Applicants: Beijing E-Town Semiconductor Technology Co., Ltd., Beijing (CN); Mattson Technology, Inc., Fremont, CA (US)

(72) Inventors: Manuel Sohn, Neu-Ulm (DE); Rolf Bremensdorfer, Bibertal (DE); Silke Hamm, Laupheim (DE); Dieter Hezler, Lonsee-Halzhausen (DE)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 459 days.

(21) Appl. No.: 17/405,150

(22) Filed: Aug. 18, 2021

(65) Prior Publication Data

US 2022/0059371 A1    Feb. 24, 2022

Related U.S. Application Data

(60) Provisional application No. 63/066,854, filed on Aug. 18, 2020.

(51) Int. Cl.
H01L 21/67    (2006.01)

(52) U.S. Cl.
CPC .. H01L 21/67109 (2013.01); H01L 21/67207 (2013.01); H01L 21/67248 (2013.01)

(58) Field of Classification Search
CPC .............. C23C 14/541; C23C 16/4412; C23C 16/45502; C23C 16/4585; H01J 37/3244;
(Continued)

(56) References Cited

U.S. PATENT DOCUMENTS 8,398,816 B1 * 3/2013 Gytri ................ H01L 21/67115
118/723 VE
2002/0067918 A1    6/2002 Camm et al.
(Continued)

FOREIGN PATENT DOCUMENTS

CN    1227390 C    11/2005
CN    102345112 B    8/2013
(Continued)

*Primary Examiner* — Edward Chin
(74) *Attorney, Agent, or Firm* — Dority & Manning, P.A.

(57) ABSTRACT

Apparatus, systems, and methods for processing workpieces are provided. In one example, such a method for performing a spike anneal rapid thermal process may include controlling a heat source to begin heating a workpiece supported on a workpiece support in a processing chamber. The method may further include receiving data indicative of a temperature of the workpiece. Furthermore, the method may include monitoring the temperature of the workpiece relative to a temperature setpoint. Moreover, the method may include controlling the heat source to stop heating the workpiece based at least in part on the workpiece reaching the temperature setpoint. Additionally, the method may include controlling a cooling system to begin flowing a cooling gas at a rate of about 300 slm or greater over the workpiece based at least in part on the workpiece reaching the temperature setpoint to reduce a t50 peak width of the workpiece.

11 Claims, 11 Drawing Sheets

(58) Field of Classification Search
CPC ......... H01J 37/32522; H01J 2237/2001; H01J 37/32862; H01L 21/68735; H01L 23/34; H01L 23/345; H01L 23/467; H01L 23/3675

See application file for complete search history.

(56) References Cited

U.S. PATENT DOCUMENTS

| | | |
|---|---|---|
| 2004/0058560 A1 | 3/2004 | Ranish et al. |
| 2008/0182345 A1* | 7/2008 | Sugishita ................ H01L 22/20 118/712 |
| 2010/0008656 A1 | 1/2010 | Sorabji et al. |
| 2010/0252547 A1 | 10/2010 | Timans |
| 2011/0011338 A1* | 1/2011 | Chuc ................ C23C 16/45565 118/715 |
| 2012/0149182 A1* | 6/2012 | Rey Garcia ......... H01L 31/1876 438/597 |
| 2013/0052804 A1* | 2/2013 | Song ................ C23C 16/4411 118/724 |
| 2013/0206362 A1 | 8/2013 | Li et al. |
| 2015/0144622 A1 | 5/2015 | Hong et al. |
| 2016/0284574 A1* | 9/2016 | Smargiassi ........ H01L 21/02348 |
| 2018/0350627 A1 | 12/2018 | Kirchhoff et al. |
| 2021/0156029 A1* | 5/2021 | Verbaas ................ C23C 16/46 |
| 2021/0172064 A1* | 6/2021 | Moon .................... C23C 16/52 |
| 2021/0225640 A1* | 7/2021 | Kao ................ H01J 37/32522 |

FOREIGN PATENT DOCUMENTS

| | | |
|---|---|---|
| CN | 109385618 A | 2/2019 |
| CN | 110473802 A | 11/2019 |
| CN | 113467198 A | 10/2021 |

* cited by examiner

RAPID THERMAL PROCESSING SYSTEM WITH COOLING SYSTEM

PRIORITY CLAIM

The present application claims the benefit of priority of U.S. Provisional Application Ser. No. 63/066,854, titled "Rapid Thermal Processing System with Cooling System," filed on Aug. 18, 2020, which is incorporated herein by reference.

FIELD

The present disclosure relates generally to thermal processing systems, and more to particularly rapid thermal processing systems having a cooling system.

BACKGROUND

A thermal processing chamber as used herein refers to a system that heats workpieces, such as semiconductor workpieces (e.g., semiconductor wafers). Such systems can include a support plate for supporting one or more workpieces and an energy source for heating the workpieces, such as heating lamps, lasers, or other heat sources. During heat treatment, the workpiece(s) can be heated under controlled conditions according to a processing regime.

Many thermal treatment processes require a workpiece to be heated over a range of temperatures so that various chemical and physical transformations can take place as the workpiece is fabricated into a device(s). During rapid thermal processing, for instance, workpieces can be heated by an array of lamps through the support plate to temperatures from about 300° C. to about 1,200° C. over time durations that are typically less than a few minutes.

SUMMARY

Aspects and advantages of embodiments of the present disclosure will be set forth in part in the following description, or may be learned from the description, or may be learned through practice of the embodiments.

One example aspect of the present disclosure is directed to a thermal processing system for performing rapid thermal processing of semiconductor workpieces. The system includes a processing chamber and a workpiece support configured to support a workpiece within the processing chamber. The system further includes a heat source configured to heat the workpiece and a temperature measurement system configured to generate data indicative of a temperature of the workpiece. Moreover, the system includes a cooling system configured to flow a cooling gas over the workpiece supported on the workpiece support. Additionally, the system includes a controller configured to control the heat source and the cooling system based at least in part on the data indicative of the temperature of the workpiece to provide a flow of cooling gas into the processing chamber at a rate of about 300 slm or greater to reduce a t50 peak width of a workpiece during a thermal process.

Other example aspects of the present disclosure are directed to systems, methods, devices, and processes for performing rapid thermal processing of semiconductor workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
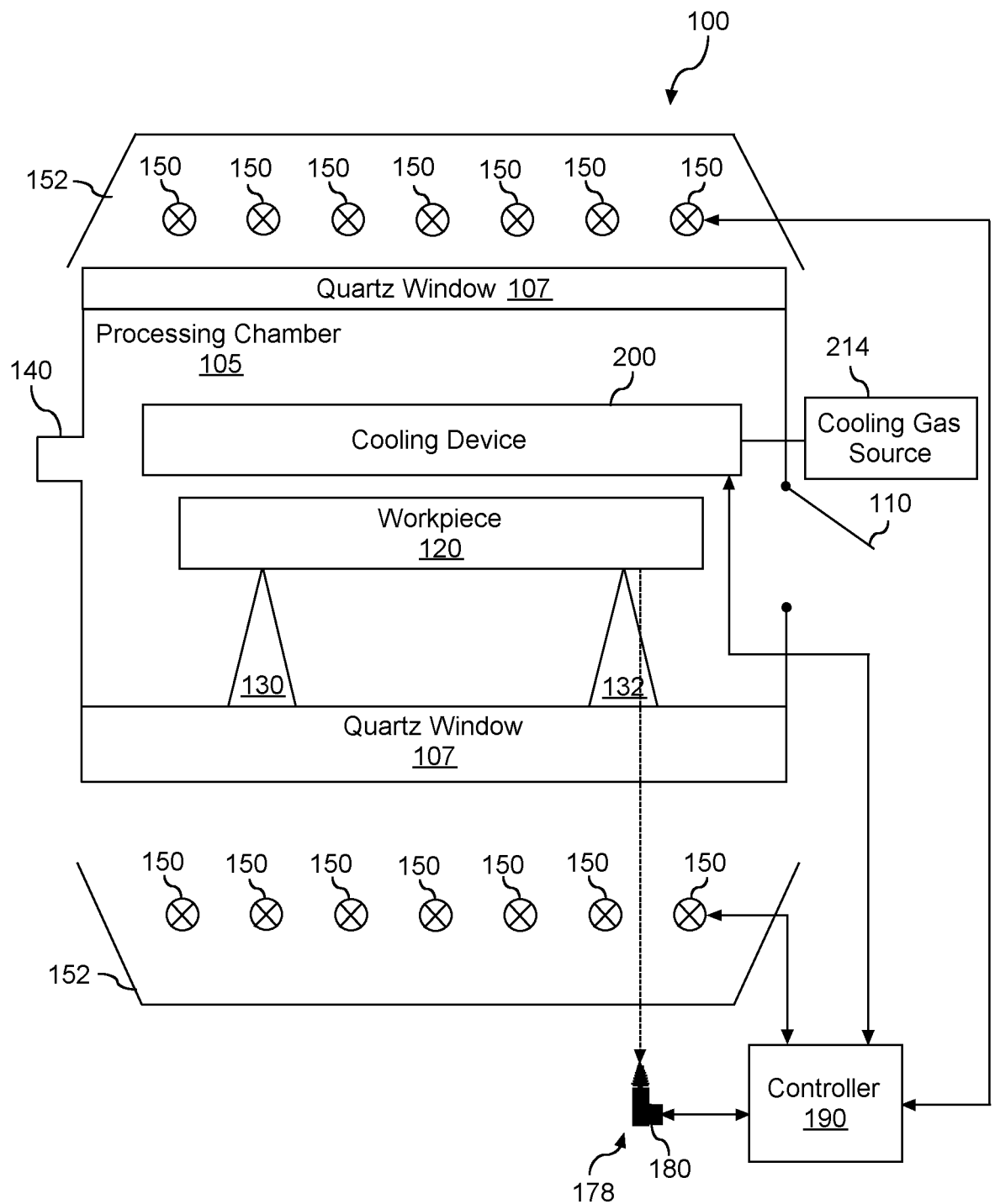
FIG. 1 depicts a rapid thermal processing system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to thermal processing systems, such as rapid thermal processing (RTP) systems, for workpieces, such as semiconductor workpieces (e.g., silicon workpieces). In particular, example aspects of the present disclose are directed to more tightly controlling a temperature profile during a thermal treatment process, such as a spike anneal process. A spike anneal process can be a thermal process which heats workpieces to high temperatures on a timescale of several seconds or less. Spike anneal processes can be used, for instance, to activate dopants in a workpiece such as a silicon wafer.

At high temperatures, dopant atoms can diffuse into the workpiece at high rates, with most of the diffusion occurring at peak annealing temperatures required to activate dopants. With increasing performance demands and decreasing device sizes in semiconductor device manufacturing, it can be desirable to tightly control a spike anneal heating profile as precisely as possible to subject the workpiece to temperature conditions which serve to activate the dopants while, at the same time, limiting diffusion of the dopants.

According to example aspects of the present disclosure, a cooling system can be disposed proximate a workpiece (e.g., a semiconductor material or wafer) configured to be heated by light emitted by one or more heat sources (e.g., lamp heat source(s), laser(s), or any other suitable light source). The cooling system can be configured to supply a flow of cooling gas over the workpiece to increase the cooling rate of the workpiece. In some embodiments, the cooling system can provide a flow of cooling gas into the processing chamber at a rate of about 300 slm or greater to reduce a t50 peak width of a workpiece during a thermal treatment process.

For instance, the cooling system can include a distribution plate positioned axially adjacent the workpiece support, where the distribution plate can have a surface parallel to the workpiece support and perpendicular to the axial direction (e.g., first and second surfaces extending perpendicular to the axial direction) and a plurality of holes extending axially therethrough, where each of the plurality of holes of the distribution plate is at a different radial distance from a center of the distribution plate. The cooling system may further include a cover plate positioned axially adjacent the distribution plate, opposite the workpiece support, and a collar coupled axially between the distribution plate and the cover plate, such that the collar, the distribution plate, and the cover plate together can define an interior chamber. A gas supply of the cooing device can be coupled to the collar to provide the cooling gas from a gas source to the interior chamber. The cooling gas provided to the interior chamber can flow out of the interior chamber through the plurality of holes in the distribution plate and across the workpiece surface.

In some example aspects of the present disclosure, each of the plurality of holes has the same cross-sectional area. However, in some aspects of the present subject matter, the shapes of the plurality of holes may change with differing radial distance. For instance, in some aspects of the present subject matter, the plurality of holes may be increasingly elongated along the radial direction with decreasing radial distance from the center of the distribution plate while maintaining the azimuthal distance, across which each of the plurality of holes extends, the same.

Moreover, in some aspects of the present disclosure, the gas supply may be configured to improve the distribution of the gas across the distribution plate and thus, across the workpiece. For instance, in some aspects, the gas supply may have an inlet plate coupled to and extending along the azimuthal direction between first and second ends of the collar spaced apart by a gap distance, where the inlet plate may include a plurality of inlet openings spaced apart along the azimuthal direction. In some aspects, the gas supply may further include a plurality of inlet tubes, where each of the plurality of inlet tubes connects a respective one of the plurality of inlet openings to the gas source. Additionally, in some aspects, the gas supply can include a baffle plate extending along at least part of the gap distance and spaced radially inwardly from the inlet plate, the baffle plate having a plurality of diffusing openings. The plurality of diffusing openings of the baffle plate and the plurality of inlet openings of the inlet plate, in some aspects, may be spaced apart along the azimuthal direction, alternate along the azimuthal direction, or both.

Further, in some aspects of the present disclosure, the cover plate may be clamped to the distribution plate to seal or render the interior chamber of the cooling system gas tight. For instance, in one aspect, the cover plate can include a plurality of flexible flanges, where each of the plurality of flexible flanges may extend along a respective azimuthal section and have an opening for receiving a respective mechanical fastener for coupling the cover plate, the collar, and the distribution plate together. The flexible flanges may be bent or displaced towards the distribution plate during a clamping process to allow the mechanical fastener to fasten the cover plate to the distribution plate, clamping the collar therebetween.

Additionally, in some aspects of the present disclosure, at least the distribution plate, the cover plate, the collar, and the gas supply can be comprised of a quartz material. As such, the parts of the cooling system that can be comprised of quartz material may be fire polished such that the number of particles generated by the cooling system during the anneal process that may contaminate the workpiece is reduced.

In some embodiments, the controllable cooling system can be used in a thermal processing system to reduce a peak width associated with a thermal treatment process (e.g., a spike anneal process). The peak width can describe a time interval when a workpiece can be at or above a reference temperature that can be obtained from subtracting a temperature value (e.g., 50K, etc.) from a peak temperature ($T_{peak}$) of a temperature time profile (e.g., a spike anneal heating profile). For instance, a 50° temperature peak width (t50 peak width) is defined as a time interval where a temperature of a surface of the workpiece is above ($T_{peak}$-50°). The reduced peak width obtained using thermal processing according to example aspects of the present disclosure can allow the thermal processing to achieve effective annealing cycles at relatively high temperatures while still reducing undesirable processes, such as excessive dopant diffusion.

In some embodiments, the thermal processing system can include a controller to control an operation (e.g., flow rate) of the cooling system during the thermal process to reduce a peak width associated with the thermal treatment process. For instance, the controller can control the operation of the cooling system to flow a cooling gas at a rate of about 300 standard liters per minute (slm) or greater over the workpiece to reduce a t50 peak width of the workpiece, such that the thermal treatment process has a t50 peak width of about 1.8 seconds or less. Additionally, the controller may be configured to control the workpiece support to rotate the workpiece at least while the cooling system flows the cooling gas over the workpiece.

In some embodiments, the controller (e.g., a computer, microcontroller(s), other control device(s), etc.) can include one or more processors and one or more memory devices.

The one or more memory devices can store computer-readable instructions that when executed by the one or more processors cause the one or more processors to perform operations, such as control an operation of the cooling system during the thermal process, or other suitable operation as described below.

One example aspect of the present disclosure is directed to a method for controlling operation of a thermal processing system. The method can include activating a heat source(s) to emit light to heat a workpiece for a spike anneal process. The method can include obtaining data indicative of a temperature of a workpiece during the spike anneal heating process. The method can further include monitoring the temperature of the workpiece relative to a temperature setpoint. Moreover, the method can include controlling the heat source to stop heating the workpiece based at least in part on the workpiece reaching the temperature setpoint. Additionally, the method can include controlling the cooling system to begin flowing a cooling gas at a rate of about 300 slm or greater over the workpiece based at least in part on the workpiece reaching the temperature setpoint to reduce a t50 peak width of the workpiece.

Another example aspect of the present disclosure is directed to a method for controlling operation of a thermal processing system. The method can include activating a heat source(s) to emit light to heat a workpiece for a spike anneal process. The method can include determining expiration of a time interval subsequent to activating the heat source(s) during the spike anneal process. The method can include upon the expiration of the time interval, controlling the heat source to stop heating the workpiece and controlling the cooling system to begin flowing a cooling gas at a rate of about 300 slm or greater over the workpiece to reduce a t50 peak width of the workpiece.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value.

Referring now to the figures, FIG. 1 depicts a thermal processing system 100 according to example embodiments of the present disclosure. As shown, the thermal processing system 100 can include a processing chamber 105. In some implementations, the processing chamber 105 can be defined, at least in part, by quartz windows 107 of the thermal processing system 100. For instance, one of the quartz windows 107 may at least partially define a ceiling of the processing chamber 105 and another of the quartz windows 107 may at least partially define a floor or bottom surface of the processing chamber 105. In some implementations, the quartz windows 107 can be doped with hydroxide OH. It should be appreciated that the one or more surfaces defining the processing chamber 105 can be formed from any suitable material. For instance, in some implementations, the one or more surfaces defining the processing chamber 105 can be formed from quartz.

As shown, the thermal processing system 100 can include a door 110 movable between an open position (FIG. 1) and a closed position (not shown) to permit selective access to the processing chamber 105. For instance, the door 110 can be moved to the open position to allow a workpiece 120 to be positioned within the processing chamber 105. In some implementations, the workpiece 120 can be supported, at least in part, by support pins 130, 132 of the lower one of the quartz windows 107. In this manner, heat associated with emitting light onto the lower quartz window 170 can be transferred to the workpiece 120 via the support pins 130, 132. In some embodiments, the workpiece 120 may be rotatable within the processing chamber 105, for instance, during a thermal treatment process. For example, the support pins 130, 132 may be configured to rotate relative to the lower one of quartz windows 107. Furthermore, the door 110 can be moved to the closed position once the workpiece 120 is disposed on the support pins 130, 132 of the lower quartz window 107. In some implementations, the processing chamber 105 can be sealed off from an external environment when the door 110 is in the closed position.

In some implementations, the one or more surfaces defining the processing chamber 105 can define a gas inlet port 140. In this manner, a process gas provided from a gas source can flow into the processing chamber 105 via the gas inlet port 140. In some implementations, the process gas can include an inert gas that does not react with the workpiece 120. Alternatively, the process gas can include a reactive gas that reacts with workpiece 120 to deposit a layer of material on the surface of the workpiece 120. For instance, in some implementations, the process gas can include ammonium $NH_3$ gas. It should be appreciated, however, that the process gas can include any suitable reactive gas. For instance, in alternative implementations, the reactive gas can include $H_2$ gas.

The thermal processing system 100 can include one or more heat sources 150 disposed outside of the processing chamber 105. For instance, the heat sources 150 may be positioned above the processing chamber 105, below the processing chamber 105, or both above and below the processing chamber 105. The one or more heat sources 150 can be configured to emit light towards the workpiece 120 during a thermal treatment process, such as a rapid thermal treatment, or a spike anneal thermal process. More particularly, the heat sources 150 positioned above the processing chamber 105 may be configured to emit light towards an upper surface or side of the workpiece 120 and the heat sources 150 positioned below the processing chamber 105 may be configured to emit light towards a lower surface or side of the workpiece 120 during a thermal treatment process. The light emitted from the one or more heat sources 150 can raise a temperature of the workpiece 120. In some implementations, the one or more heat sources 150 can increase the temperature of the workpiece 120 by greater than about 500° C. within a predetermined amount of time (e.g., less than 2 seconds).

It should be appreciated that the one or more heat sources 150 can include any suitable type of heat source configured to emit light. For instance, in some implementations, the one or more heat sources 150 can include one or more heat lamps (e.g., linear lamps). In alternative implementations, the one or more heat sources 150 can include one or more lasers configured to emit a laser beam onto the workpiece 120. It should further be appreciated that the heat sources 150 positioned above the processing chamber 105 may be controlled separately from the heat sources 150 positioned below the processing chamber 105 or may be controlled together for performing a thermal treatment process.

In some implementations, the thermal processing system 100 can include one or more reflectors 152 positioned such that the light emitted from the one or more heat sources 150 is directed to or towards the processing chamber 105. More specifically, the reflectors 152 can direct the light emitted from the one or more heat sources 150 to or towards the respective quartz window 107 such that the light can pass through the respective quartz window 107 and into the processing chamber 105. It should be appreciated that at least a portion of the light entering the processing chamber 105 via the quartz window(s) 107 can be emitted onto the workpiece 120. In this manner, the light emitted from the one or more heat sources 150 can, as discussed above, raise the temperature of the workpiece 120 during a thermal treatment process, such as a rapid thermal treatment process (e.g., spike anneal treatment).

In one implementation, the thermal processing system 100 can include a temperature measurement system 178 configured to generate and communicate data indicative of a temperature of the workpiece 120. The temperature measurement system 178 may include one or more temperature sensors 180. The temperature sensor(s) 180 may comprise pyrometer(s), thermocouple(s), thermistor(s), or any other suitable temperature sensor or combination of temperature sensors. The temperature sensor(s) 180 may be positioned within the processing chamber 105 or may be positioned exterior to the processing chamber 105, depending on the type of sensor. For example, if the temperature sensor(s) 180 is a pyrometer, the pyrometer does not need to contact the workpiece 120, and thus, may be positioned exterior to the chamber 105. However, if the temperature sensor(s) 180 is a thermocouple, the thermocouple must be in contact with the workpiece 120, and thus, may be positioned interior to the chamber 105. Further, the temperature sensor(s) 180 may be communicatively coupled to a controller 190, by a wired connection, a wireless connection, or both, such that the data generated by the sensor(s) 180 indicative of the temperature of the workpiece 120 may be provided to the controller 190.

According to example aspects of the present disclosure, the thermal processing system 100 includes a cooling system 200, as will be described below in greater detail, configured to selectively flow cooling gas from a gas source 214 across the workpiece 120 during a thermal process. The controller 190 can control an operation of the heat source(s) 150 and the cooling system 200 (e.g., a flow rate of cooling gas across the workpiece 120) during a thermal process to reduce a peak width associated with a thermal treatment process. For instance, the controller 190 can control the operation of the cooling system 200 such that the thermal treatment process has a t50 peak width of about 1.8 seconds or less, such as about 1.5 seconds or less. Additionally, the controller 190 can control the rotation of the workpiece 120. For instance, the controller 190 can control the workpiece support (e.g., support pin(s)) such that the workpiece 120 is rotated during a thermal process, such as while the cooling system 200 is operated.

In some embodiments, the controller 190 or control devices (e.g., a computer, microcontroller(s), other control device(s), etc.) can include one or more processors and one or more memory devices. The one or more memory devices can store computer-readable instructions that when executed by the one or more processors cause the one or more processors to perform operations, such as turning on or turning off the heat source(s) 150, controlling an operation of the cooling system 200 during the thermal process, or other suitable operation as will be described below.

Figure 2:
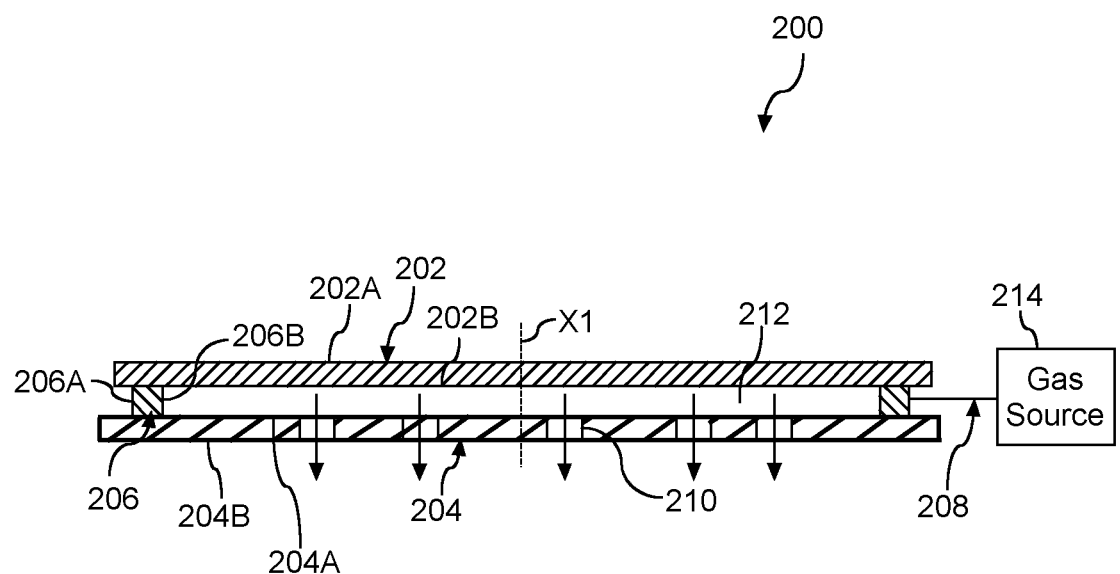
FIG. 2 depicts a cross-sectional view of an example cooling system of a thermal processing system according to example embodiments of the present disclosure.
Figure 3:
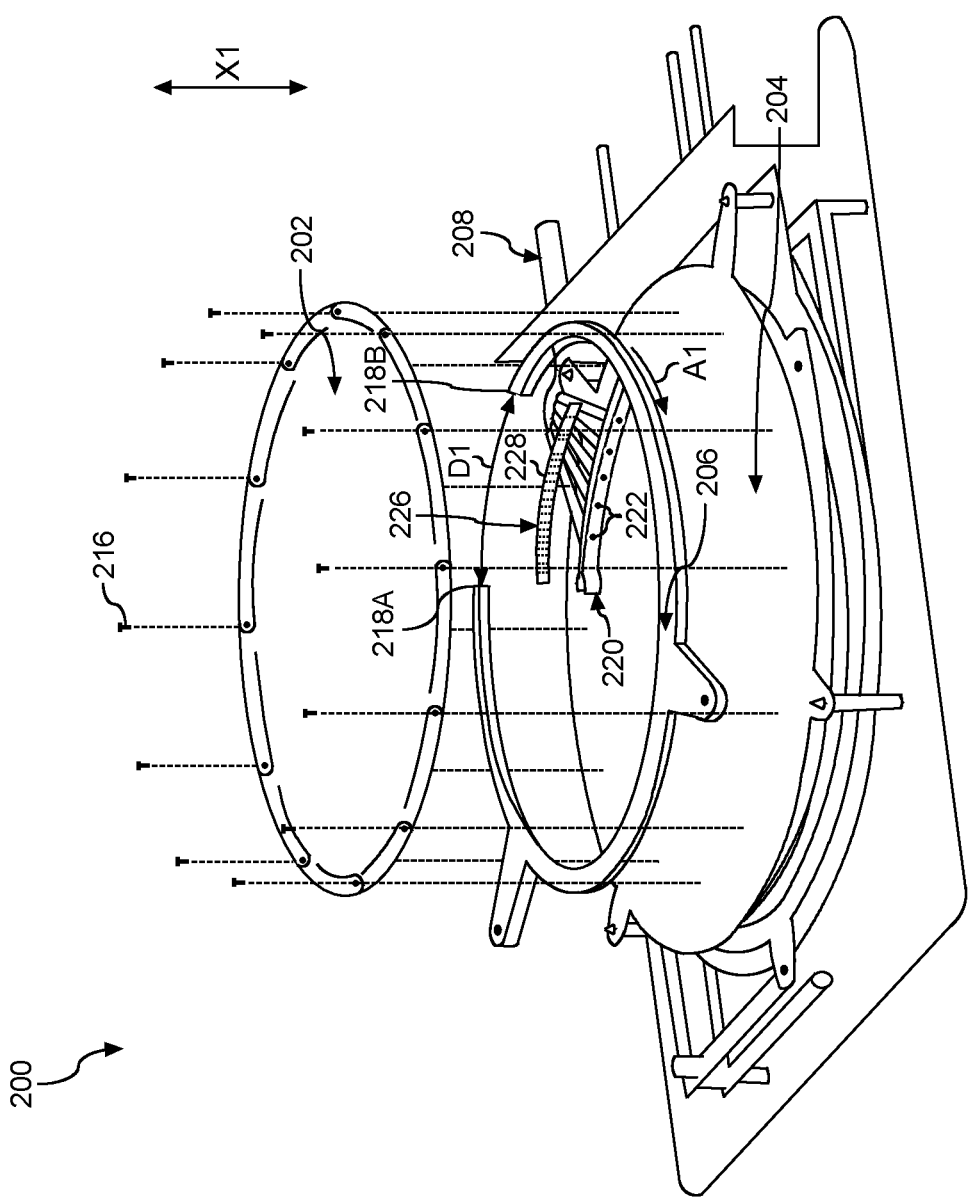
FIG. 3 depicts an exploded, perspective view of an example cooling system of a thermal processing system according to example embodiments of the present disclosure.
Figure 4:
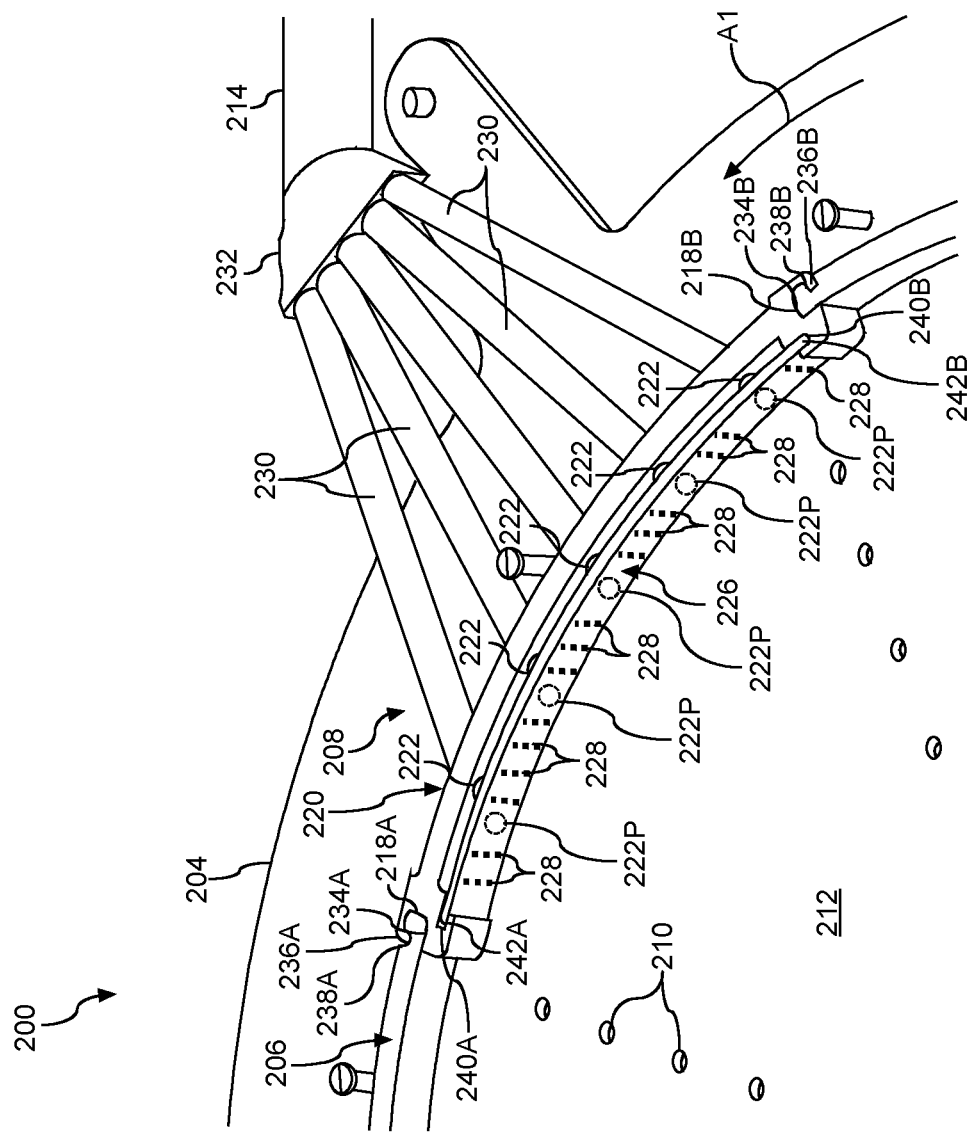
FIG. 4 depicts a partial, perspective view of an example cooling system of a thermal processing system, particularly illustrating a gas supply of the cooling system according to example embodiments of the present disclosure.
Figure 5:
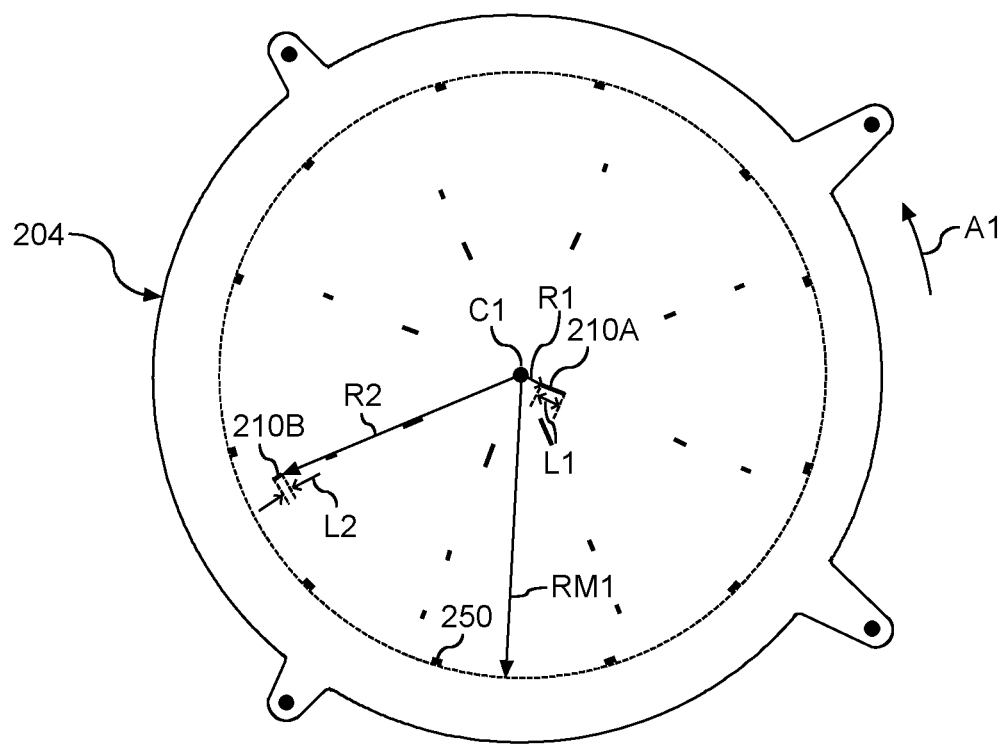
FIG. 5 depicts a top-down view of a distribution plate of an example cooling system of a thermal processing system according to example embodiments of the present disclosure.
Figure 6:
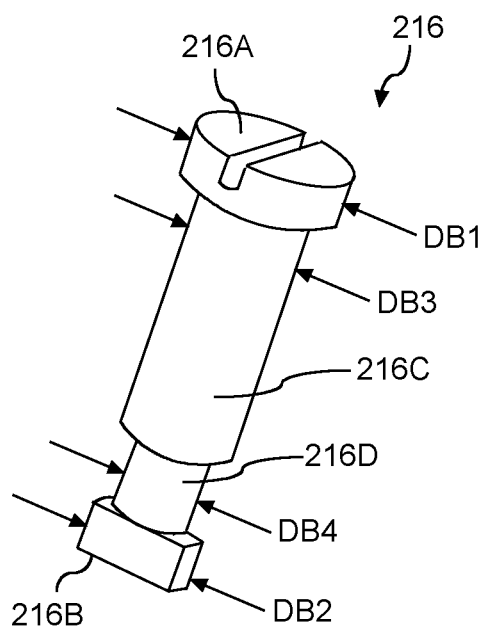
FIG. 6 depicts a perspective view of a mechanical fastener of an example cooling system of a thermal processing system according to example embodiments of the present disclosure.
Figure 7:
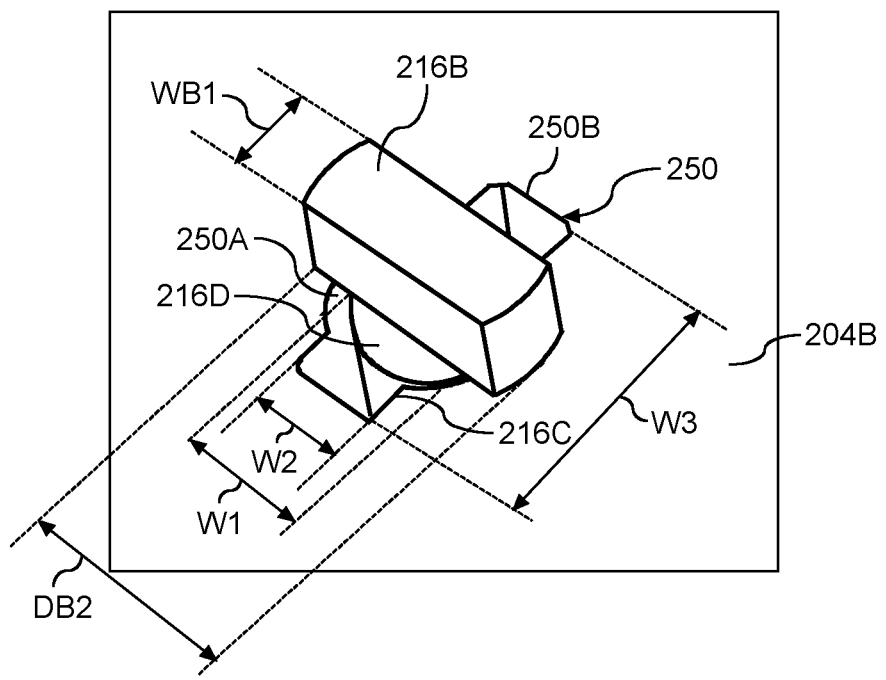
FIG. 7 depicts a bottom, perspective view of an example cooling system of a thermal processing system, particularly illustrating a mechanical fastener coupled to a cover plate of the cooling system according to example embodiments of the present disclosure.
Figure 8:
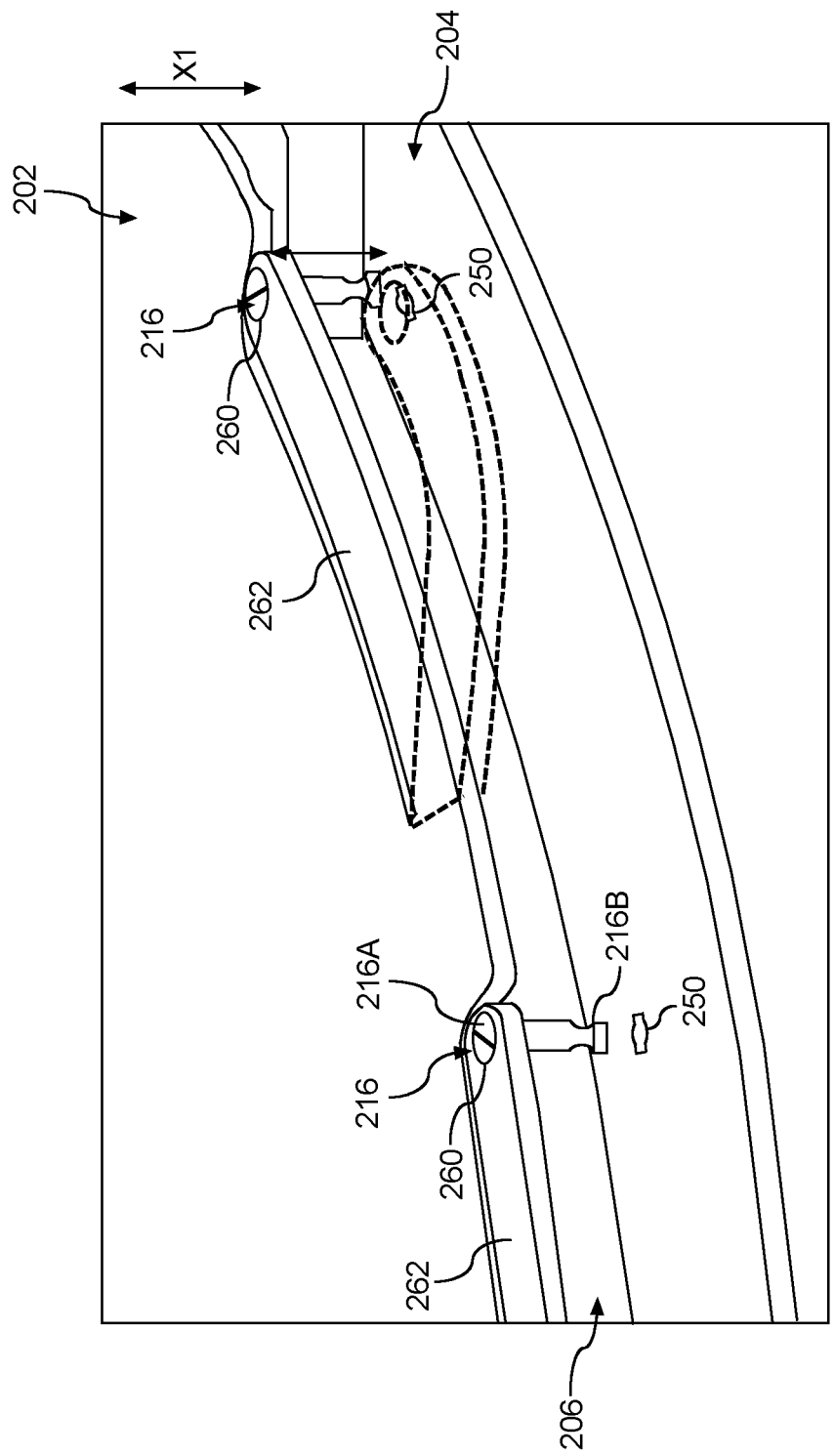
FIG. 8 depicts a partial, perspective view of an example cooling system of a thermal processing system, particularly illustrating flexible flanges of a cover plate of the cooling system according to example embodiments of the present disclosure.

Turning now to FIGS. 2-8, example aspects of a cooling system 200 of a thermal processing system 100 are depicted. More particularly, FIG. 2 depicts a cross-sectional view of the cooling system 200 and FIG. 3 depicts an exploded, perspective view of the cooling system 200. Further, FIG. 4 depicts a partial, perspective view of the cooling system 200, particularly illustrating a gas supply of the cooling system 200. Moreover, FIG. 5 depicts a top-down view of a distribution plate of the cooling system 200. Furthermore, FIGS. 6 and 7 depict a mechanical fastener of the cooling system 200. Additionally, FIG. 8 depicts a partial, perspective view of the cooling system 200, particularly illustrating flexible flanges of a cover plate of the cooling system 200.

As shown in FIG. 2, the cooling system 200 comprises a cover plate 202, a distribution plate 204, a collar 206, and a gas supply 208, each of which may be comprised of quartz. The cover plate 202 extends along an axial direction X1 between an upper surface 202A and a lower surface 202B. The cover plate 202 is continuous such that it has no openings extending axially therethrough through which cooling gas may flow. The distribution plate 204 similarly extends along the axial direction X1 between an upper surface 204A and a lower surface 204B, where the lower surface 204B is positioned axially closer to a workpiece (e.g., workpiece 120 in FIG. 1) supported in the processing chamber 105 (FIG. 1) than the upper surface 204A. At least the lower surface 204B of the distribution plate 204 extends perpendicular to the axial direction X1 such that it is generally parallel to the workpiece surface (FIG. 1) or a support plane of the workpiece support 130, 132 (FIG. 1). Unlike the cover plate 202, the distribution plate 204 has a plurality of holes 210 extending therethrough, as will be described below in greater detail. In one embodiment, the holes 210 extend along the axial direction X1. However, in other embodiments, the holes 210 may instead extend at an angle relative to the axial direction X1. The cover plate 202 is generally positioned axially adjacent to the distribution plate 204, opposite the workpiece support 130, 132 (FIG. 1).

The collar 206 extends radially between an outer side 206A and an inner side 206B. The collar 206 is positioned axially between the lower surface 202B of the cover plate 202 and the upper surface 204A of the distribution plate 204 such that an interior chamber 212 is defined between the radially inner side 206B of the collar 206, the lower surface 202B of the cover plate 202, and the upper surface 204A of the distribution plate 204. The gas supply 208 is configured to selectively supply the interior chamber 212 cooling gas from the gas source 214. The cooling gas supplied to the interior chamber 212 may then flow from the interior chamber 212 via the holes 210 and across a workpiece supported below the cooling system 200.

As particularly shown in the exploded view of the cooling system 200 in FIG. 3, the cover plate 202 is able to be directly coupled to the distribution plate 204 by a plurality of mechanical fasteners 216 as will be described below in greater detail. Further, the collar 206 has a gap extending along an azimuthal direction A1 between a first azimuthal end 218A and a second azimuthal end 218B. The first and second azimuthal ends 218A, 218B are spaced apart by a gap distance D1 along the azimuthal direction A1. The gas supply 208 comprises an inlet plate 220 that is able to be installed or coupled between the first and second azimuthal ends 218A, 218B of the collar 206. When installed, the inlet plate 220 extends along the azimuthal direction A1 along the entire gap distance D1 to define at least a portion of the interior chamber 212. However, it should be appreciated that the inlet plate 220 may instead extend linearly between the first and second ends 218A, 218B of the collar. In one aspect, the inlet plate 220 includes a plurality of inlet openings 222 spaced apart along the azimuthal direction A1 through which cooling gas is supplied into the interior chamber 212, as will be described in greater detail below. In some embodiments, the gas supply 208 further includes a baffle plate 226. The baffle plate 226 is spaced radially inwardly from the inlet plate 220 and extends along at least a portion of the gap distance D1. For instance, in some aspects, the baffle plate 226 is coupled to a radially inward portion of the inlet plate 220 to define at least a portion of the interior chamber 212. In some aspects, the baffle plate 226 includes a plurality of diffusing openings 228 through which cooling gas supplied through the inlet openings 222 must travel before being received in the interior chamber 212, as will be described in greater detail below.

Turning now to FIG. 4, the gas supply 208 is configured to evenly disperse cooling gas across the distribution plate 204. For instance, as discussed above, the inlet openings 222 of the inlet plate 220 are spaced apart along the azimuthal direction A1. For instance, in some embodiments, the inlet openings 222 may be spaced evenly apart along the azimuthal direction A1. Further, the inlet openings 222 may, in some embodiments, have the same cross-sectional area. Each of the inlet openings 222 is, in turn, coupled via a respective inlet tube 230 to the cooling gas source 214. More particularly, each inlet tube 230 is connected at its first end to a respective one of the inlet openings 222 and at its second end to an adapter 232. The adapter 232 is configured to connect the second end of inlet tube 230 to the gas source 214. However, it should be appreciated that, in some embodiments, each inlet tube 230 may be separately coupled to the gas source 214 (e.g., by respective adapters or couplings). The inlet openings 222 and tubes 230 divide a flow of cooling gas from the gas source 214 such that the gas enters the interior chamber at multiple azimuthal positions. In some embodiments, the inlet openings 222 and the tubes 230 evenly divide the flow of cooling gas from the gas source 214. However, in some embodiments, different pairings of the inlet openings 22 and the tubes 230 may provide a different proportion of the flow of cooling gas from the gas source 214 to the interior chamber. While five inlet openings 222 and tubes 230 are illustrated, the gas supply 208 may include any other suitable number, such as four or fewer, or such as six or more.

Moreover, in some embodiments, the baffle plate 226 is positioned radially inwardly of the inlet plate 220 and includes its own diffusing openings 228, as discussed above. In some aspects, the diffusing openings 228 are smaller in cross-section and more numerous than the inlet openings 222 such that the gas flowed through the inlet openings 222 is further divided by the diffusing openings 228. In one aspect, the diffusing openings 228 may be positioned at different azimuthal positions from the inlet openings 222. For instance, projections 222P of the inlet openings 222 in FIG. 4 illustrate the respective azimuthal positions of the inlet openings 222 relative to the diffusing openings 228. The projections 222P of the inlet openings 222 are spaced apart along the azimuthal direction A1 from the diffusing openings 228. Further, the projections 222P of the inlet openings 222 alternate with the diffusing openings 228 along the azimuthal direction A1 such that at least one of the diffusing openings 228 is positioned between each pair of neighboring projections 222P along the azimuthal direction A1. By offsetting the inlet openings 222 and the diffusing openings 228 along the azimuthal direction A1, more turbulent flow is generated between the inlet plate 220 and the baffle plate 226 which provides more even distribution of the cooling gas through the diffusing openings 228.

As further shown in FIG. 4, the inlet plate 220 and the collar 206, in one aspect, have locking features that couple together to form a slip-tight seal. More particularly, the inlet plate 220 has a first channel 234A for receiving the first azimuthal end 218A of the collar 206 and a similar, second channel 234B for receiving the second azimuthal end 218B of the collar 206. The inlet plate 220, in one aspect, further includes a first lip or protruding portion 236A, which is receivable within a first recess 238A formed in the collar 206 proximate the first azimuthal end 218A, and a similar, second lip or protruding portion 236B, which is receivable within a second recess 238B formed in the collar 206 proximate the second azimuthal end 218B. Such locking features 234, 236, 238 form an air-tight seal such that when the cover plate 202 is coupled to the distribution plate 204 with the collar 206 and inlet plate 220 therebetween, cooling gas may only enter the interior chamber 212 through the inlet plate 220 and exit the interior chamber 212 through the holes 210 in the distribution plate 204.

Additionally, in one embodiment, the baffle plate 226 is configured to be coupled to the inlet plate 220 as indicated above and shown in FIG. 4. For instance, the inlet plate 220 includes a first channel 240A for receiving a first azimuthal end 242A of the baffle plate 226 and a similar, second channel 240B for receiving a second azimuthal end 242B of the baffle plate 226. Such channels 240A, 240B may form an air-tight seal with the baffle plate 226 when the cover plate 202 is coupled to the distribution plate 204 with the collar 206, inlet plate 220, and baffle plate 226 therebetween such that cooling gas may only enter the interior chamber 212 through the diffusing openings 228 and exit the interior chamber 212 through the holes 210 in the distribution plate 204.

Turning now to FIG. 5, the distribution plate 204 is separately configured to evenly disperse the cooling gas flowing therethrough across a workpiece. For instance, each of the holes 210 in the distribution plate 204 is spaced apart from a center C1 of the distribution plate 204 by a different radial distance. For instance, a radially innermost, first hole 210A of the holes 210 in the distribution plate 204 is spaced apart from the center C1 by a first distance R1 and a radially outermost, second hole 210B of the holes 210 in the distribution plate 204 is spaced apart from the center C1 by a second distance R2. In one embodiment, the holes 210 in the distribution plate 204 spiral outwardly from the first hole 210A to the second hole 210B by increasingly larger radial distances.

In some aspects, the holes 210 in the distribution plate 204 have a same cross-sectional area. Further, in one aspect, the holes 210 extend across a same azimuthal distance. In order for the holes 210 to have a same cross-sectional area and extend across a same azimuthal distance, the holes 210 have varying shapes. More particularly, the holes 210 become increasingly elongated along the radial direction with decreasing radial distance from the center C1 of the distribution plate 204. For instance, as the holes 210 spiral outwardly away from the first hole 210A, the radial distance across which each successive hole 210 extends becomes shorter and shorter until reaching the second hole 210B, which extends across the shortest radial distance. For example, the first hole 210A extends along a first radial distance L1 and the second hole 210B extends along a second radial distance L2, where the first radial distance L1 is greater than the second radial distance L2.

Additionally, the distribution plate 204 has a plurality of mounting holes 250 for receiving the mechanical fasteners 216 (FIG. 3) to mount the cover plate 202 (FIG. 3) to the distribution plate 204. The mounting holes 250 are spaced apart from the center C1 of the distribution plate 204 by a radial distance RM1, where the radial distance RM1 is greater than the second radial distance L2 at which the radially outermost hole 210B is positioned. In one embodiment, the collar 206, the inlet plate 220, and the baffle plate 226 (FIG. 4) are configured to be positioned at a radial distance between the second radial distance L2 and the radial distance RM1. In some embodiments, the mounting holes 250 are evenly spaced apart along the azimuthal direction A1.

As described with reference to FIGS. 6-8, in one embodiment, each of the mechanical fasteners 216 is configured as a bayonet pin (hereafter referred to as "bayonet 216"). The bayonet 216 extends between a first portion 216A at its first end and a second portion 216B at its second end. As particularly shown in FIGS. 6 and 7, the bayonet 216 further includes a third portion 216C and optionally a fourth portion 216D, with the third portion 216C being positioned between the first portion 216A and the fourth portion 216D, and the fourth portion 216D being positioned between the third portion 216C and the second portion 216B. As shown in FIG. 6, the first portion 216A has a first diameter or width DB1, the second portion 216B has a second diameter or width DB2, the third portion 216C has a third diameter or width DB3, and the fourth portion has a fourth diameter or width DB4. The first diameter DB1 is larger than the second diameter DB2, the second diameter DB2 is larger than the third diameter DB3, and the third diameter DB3 is larger than the fourth diameter DB4.

When the bayonet 216 is in an installed or fastened position, the first portion 216A of the bayonet 216 is configured to be held within an opening or recess 260 (FIG. 8) in the cover plate 202 having a diameter that generally corresponds to the first diameter DB1, such that the first portion 216A of the bayonet 216 cannot pass completely through the cover plate 202. Further, the third portion 216C of the bayonet 216 is configured to extend at least partially through the cover plate 202 (e.g., through the portion of the cover plate 202 below the recess 260 in FIG. 8) and at least partially through the mounting hole 250 in the distribution plate 204 as shown in FIG. 7. Moreover, the fourth portion 216D of the bayonet 216, when present, extends at least partially through the mounting hole 250 in the distribution plate 204 as shown in FIG. 7. Additionally, the second portion 216B is configured to abut or rest against the lower surface 204B of the distribution plate 204.

More particularly, the mounting hole 250 has a first contour portion 250A and a second contour portion 250B. The first contour portion 250A is generally circular and has a diameter or width W1 that generally corresponds to the third diameter DB3 of the third portion 216C of the bayonet. The second contour portion 250B is generally rectangular and intersects the first contour portion 250A, where the second contour portion 250B has a width W2 in a first direction generally corresponding to a width WB1 of the second portion 216B of the bayonet 216 and a width W3 in a second direction generally corresponding to the second diameter DB2 of the second portion 216B of the bayonet 216. The bayonet 216 is configured to be inserted through the mounting hole 250 when in a first rotational position (FIG. 8), such that at least a portion of the second portion 216B of the bayonet 216 and the third and fourth portions 216C, 216D of the bayonet 216 are configured to pass through the first contour portion 250A and the remaining part of the second portion 216B of the bayonet 216 passes through the second contour portion 250B. Once the bayonet 216 is fully inserted through the mounting hole 250, such that the second portion 216B of the bayonet 216 extends past the mounting hole 250, the bayonet 216 may be rotated form the first rotational position (FIG. 8) to a second rotational position (FIG. 7), such that the bayonet 216 cannot pass back through or be removed from the mounting hole 250 without first being rotated back to the first rotational position.

As particularly shown in FIG. 8, when the cover plate 202 is positioned on the collar 206, but not fastened or coupled to the distribution plate 204, the bayonets 216 cannot extend through the mounting holes 250. As such, the cover plate 202 includes a plurality of flexible flanges 262 extending along its outer perimeter. Each of the flanges 262 extends along a respective azimuthal section of the cover plate 202. Each flange 262 includes a respective one of the openings 260 for receiving the bayonet 216. When it is desired to couple the cover plate 202 to the distribution plate 204, a bayonet 216 may be inserted into a respective opening 260 and an external force may be applied in the axial direction X1 to bend or flex the flange into an installation position (indicated in dashed lines). The force required to bend or flex the flange into the installation position may be subsequently provided by the respective bayonet 216 when the bayonet 216 is rotated into the second rotational position (FIG. 7). Such continued force helps to seal the interior chamber 212 (FIG. 2) to prevent the cooling gas from exiting the chamber 212 except for through the openings 210 (FIG. 2).

It should be appreciated that the mechanical fasteners 216 may be configured as any other suitable mechanical fastener or combination of fasteners, including, but not limited to, screws, bolts, rivets, and/or the like.

It should further be appreciated that the cooling system 200 is mainly or completely comprised of quartz material. For instance, in one embodiment, at least the cover plate 202, the distribution plate 204, the collar 206, the inlet plate 220, the baffle plate 226, and the inlet tubes 230 each comprise quartz material. Further, in some embodiments, the fasteners 216 are comprised of quartz material. The components of the cooling system 200 comprise of quartz may be fire polished such that the number of particles generated by the cooling system 200 during an anneal process that may contaminate the workpiece is reduced.

Figure 9:
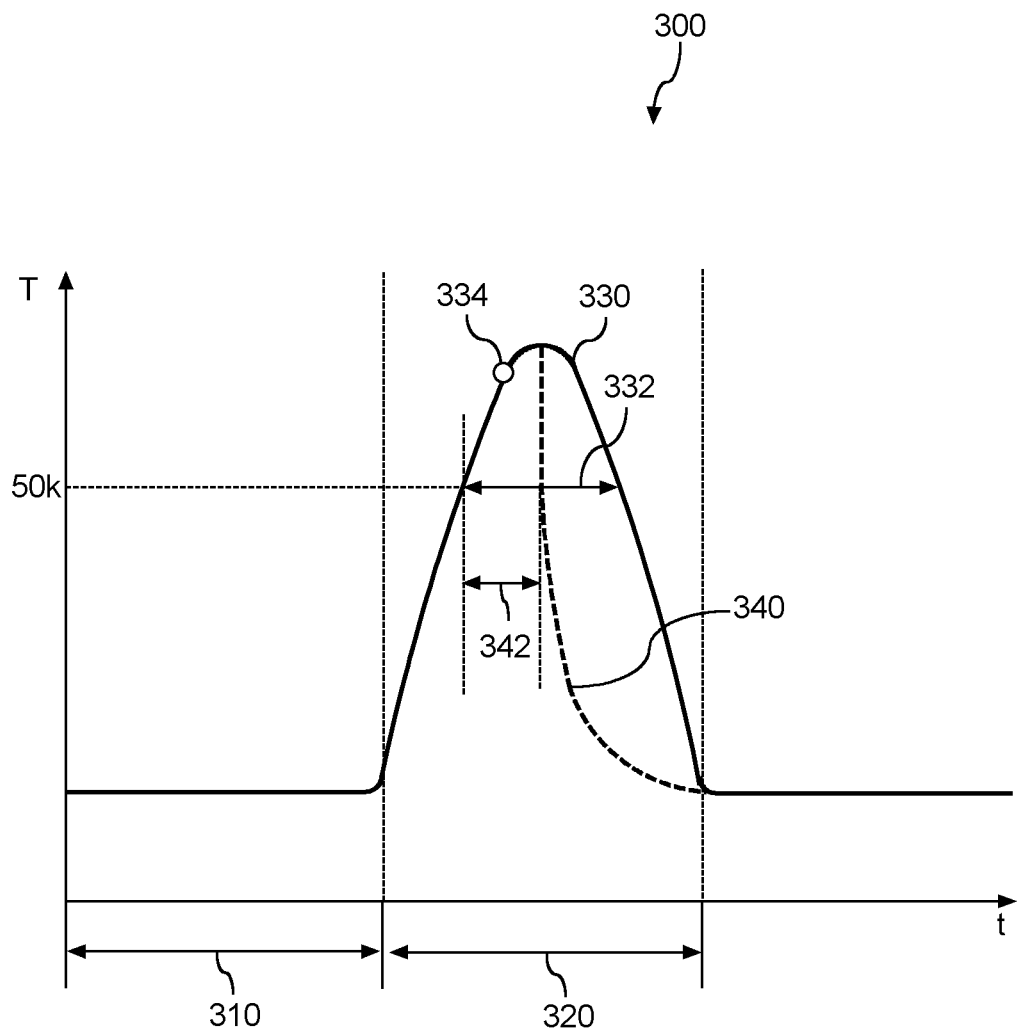
FIG. 9 depicts an example temperature time profile of a thermal processing system according to example embodiments of the present disclosure.

FIG. 9 depicts an example temperature time profile 300 of a thermal processing system 100 according to example embodiments of the present disclosure. As can be seen in FIG. 9, subsequent to a first time period 310, a spike anneal process occurs during a second time period 320. A heating profile 330 (solid-line curve) can be generated by a conventional spike anneal. In the conventional spike anneal, one or more heat sources (e.g., heat sources 150) is controlled to emit light to heat a workpiece while monitoring the temperature of the workpiece relative to a temperature setpoint 334. In one aspect, the temperature setpoint 334 is within about 20% of a peak temperature of the heating profile 340 of the thermal processing system 100. The heat sources may be configured to stop emitting light once the temperature of the workpiece reaches or surpasses the temperature setpoint 334. The conventional spike anneal can have a 50° temperature (e.g., 50K) peak width (t50 peak width) 332 of the heating profile 330. A heating profile 340 (dash-line curve) can be generated by the thermal processing system 100 by controlling the cooling system 200 to begin flowing cooling gas over the workpiece at a rate of 300 slm or greater based at least upon the temperature of the workpiece reaching or surpassing the temperature setpoint 334. For instance, the cooling system 200 may be controlled to begin flowing the cooling gas over the workpiece when the temperature of the workpiece 120 reaches the temperature setpoint 334. Alternatively, the cooling system 200 may be controlled to begin flowing the cooling gas over the workpiece when a second temperature setpoint (not shown) expires, where the second temperature setpoint may be between the first temperature setpoint 334 and the peak desired temperature, or may be less than the first temperature setpoint 334. A t50 peak width 342 of the heating profile 340 of the thermal processing system 100 using the cooling system 200 is less than the t50 peak width 332 of the heating profile 330 of the conventional spike anneal process.

Figure 10:
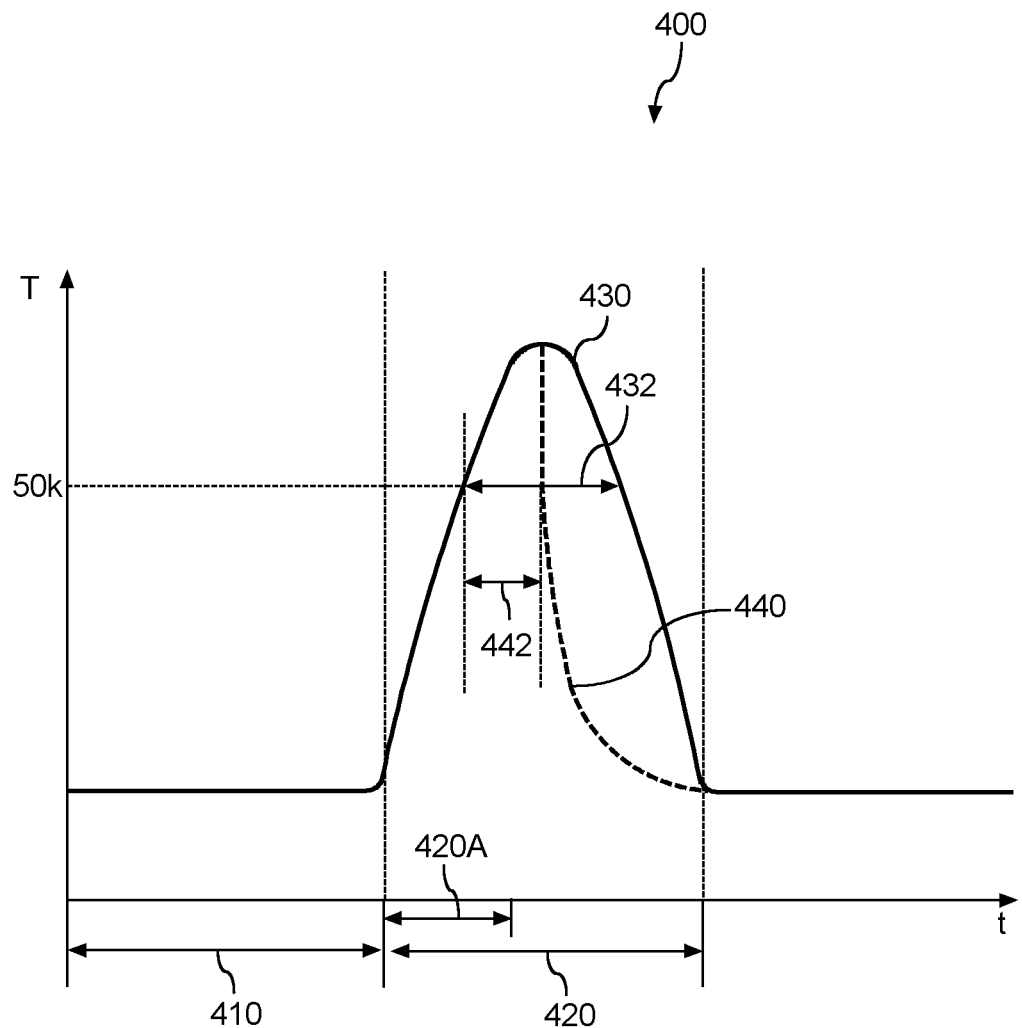
FIG. 10 depicts an example temperature time profile of a thermal processing system according to example embodiments of the present disclosure.

FIG. 10 depicts an example temperature time profile 400 of a thermal processing system 100 according to example embodiments of the present disclosure. As can be seen in FIG. 10, subsequent to a first time period 410, a spike anneal process occurs during a second time period 420. A heating profile 430 (solid-line curve) can be generated by a conventional spike anneal. In the conventional spike anneal, one or more heat sources (e.g., heat sources 150) is controlled to emit light to heat a workpiece for a predetermined time interval 420A of the second time period 420A corresponding to the workpiece being able to reach the peak temperature. In one aspect, the predetermined time interval 420A is in a range of about 5 milliseconds to about 100 milliseconds. The conventional spike anneal can have a 50° temperature (e.g., 50K) peak width (t50 peak width) 432 of the heating profile 430. A heating profile 440 (dash-line curve) can be generated by the thermal processing system 100 by controlling the cooling system 200 to begin flowing cooling gas over the workpiece at a rate of 300 slm or greater based at least upon the expiration of the predetermined time interval 420A of operating the heat sources. For instance, the cooling system 200 may be controlled to begin flowing the cooling gas over the workpiece when the time interval 420A expires. Alternatively, the cooling system 200 may be controlled to begin flowing the cooling gas over the workpiece when a second time interval (not shown) expires, where the second time interval may begin at the expiration of the first time interval 420A and be in a range of about 5 milliseconds to about 100 milliseconds. A t50 peak width 442 of the heating profile 340 of the thermal processing system 100 using the cooling system 200 is less than the t50 peak width 432 of the heating profile 430 of the conventional spike anneal process.

Figure 11:
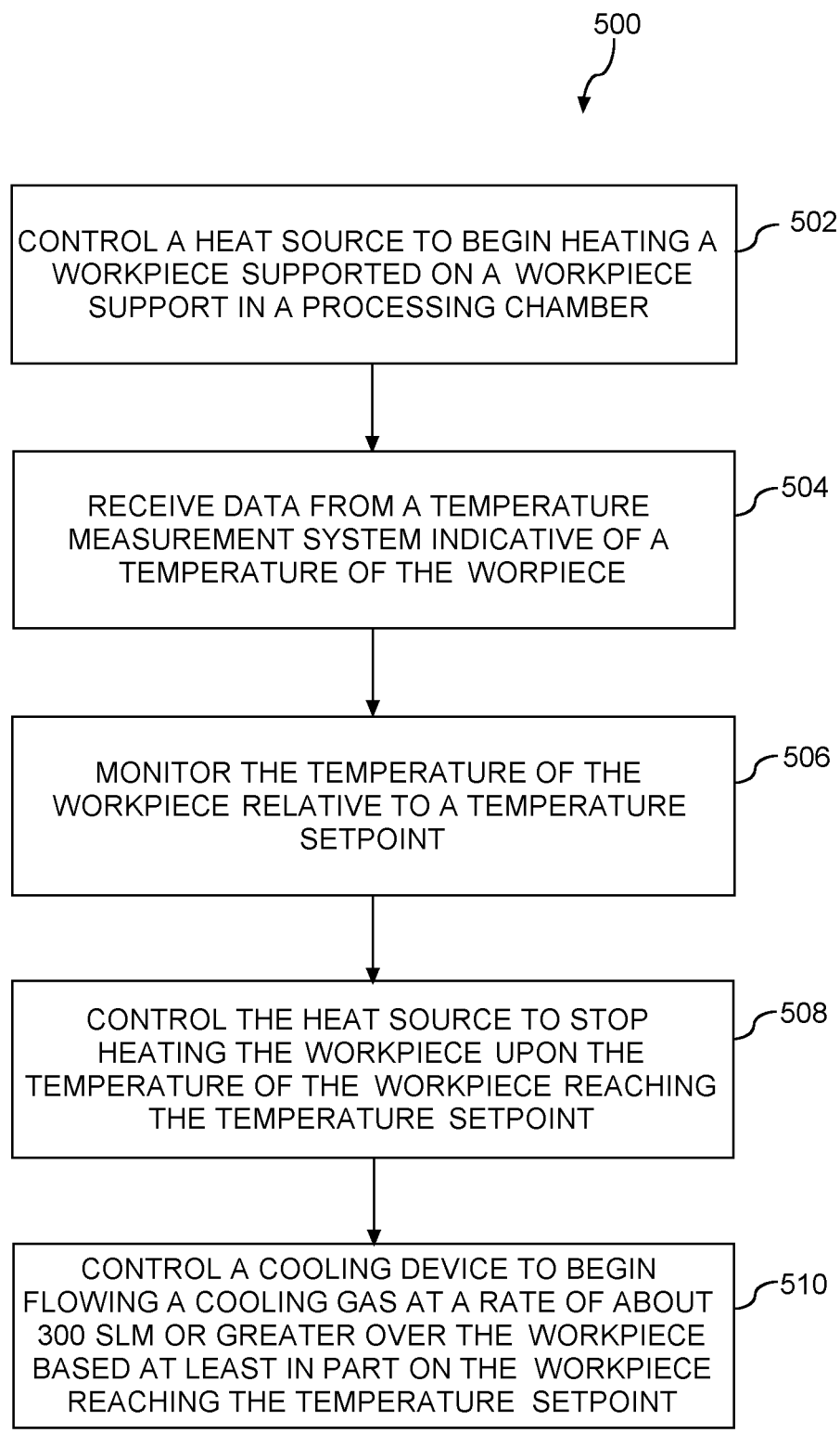
FIG. 11 depicts a flow diagram of an example method according to example embodiments of the present disclosure.

FIG. 11 depicts a flow diagram of an example method (500) according to example embodiments of the present disclosure. The method (500) will be discussed with reference to the thermal processing system 100 of FIG. 1 by way of example. The method (500) can be implemented in any suitable plasma processing apparatus. FIG. 11 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (502), the method 500 can include controlling a heat source to begin heating a workpiece supported on a workpiece support within a processing chamber. For instance, a controller 190 of the thermal processing system 100 can control a heat source(s) 150 to begin heating (i.e., emitting light towards) a workpiece 120 supported on a workpiece support 130, 132 within a processing chamber 105.

At (504), the method 500 can further include receiving data from a temperature measurement system indicative of a temperature of a workpiece during a spike anneal process. For instance, the thermal processing system 100 can include one or more temperature sensors 180 which can generate and communicate data indicative of a temperature of the workpiece 120.

Furthermore, at (506), the method 500 can include monitoring the temperature of the workpiece relative to a temperature setpoint. For instance, a controller 190 of the thermal processing system 100 can access data indicative of a temperature setpoint (e.g., temperature setpoint 334 described in FIG. 9). The temperature setpoint can be within about 20% of a peak temperature of a heating profile associated with the spike anneal heating profile.

Moreover, at (508), the method 500 can include controlling the heat source to stop heating the workpiece based at least in part on the temperature of the workpiece reaching the temperature setpoint. For instance, when a temperature of the workpiece 120 reaches or exceeds the temperature setpoint, the controller 190 can control the heat source(s) 150 to stop heating (i.e., emitting light towards) the workpiece 120.

Additionally, at (510), the method can include controlling a cooling system to begin flowing a cooling gas at a rate of about 300 slm or greater over the workpiece based at least in part on the temperature of the workpiece reaching the temperature setpoint. For instance, when a temperature of the workpiece 120 reaches or exceeds the temperature setpoint, the controller 190 can control a cooling system 200 of the thermal processing system to begin flowing a cooling gas at a rate of about 300 slm or greater over the workpiece 120 to reduce a t50 peak width of the workpiece.

Figure 12:
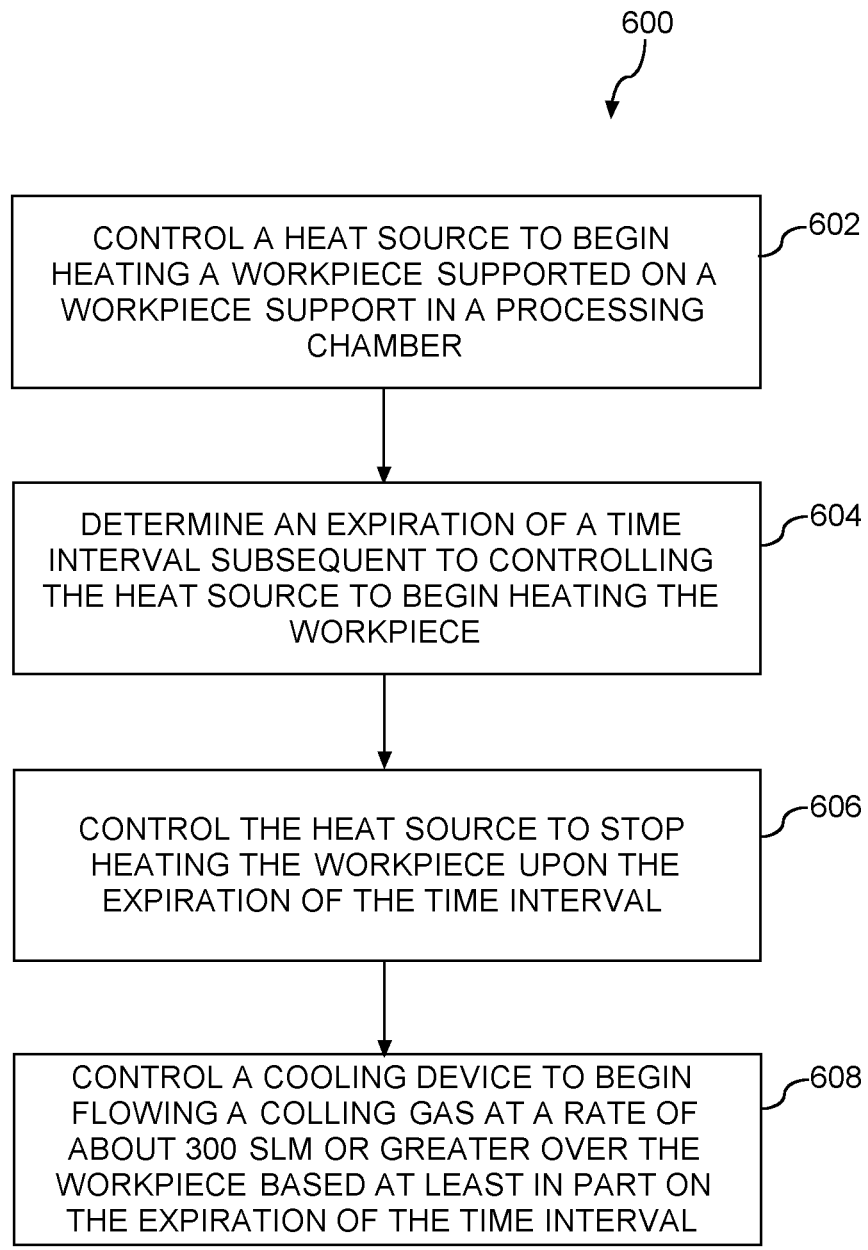
FIG. 12 depicts a flow diagram of another example method according to example embodiments of the disclosure.

FIG. 12 depicts a flow diagram of an example method (600) according to example embodiments of the present disclosure. The method (600) will be discussed with reference to the thermal processing system 100 of FIG. 1 by way of example. The method (600) can be implemented in any suitable plasma processing apparatus. FIG. 12 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (602), the method 600 can include controlling a heat source to begin heating a workpiece supported on a workpiece support within a processing chamber. For instance, a controller 190 of the thermal processing system 100 can control a heat source(s) 150 to begin heating (i.e., emitting light towards) a workpiece 120 supported on a workpiece support 130, 132 within a processing chamber 105.

Further, at (604), the method 600 can include determining expiration of a time interval subsequent to controlling the heat source to begin heating the workpiece. For instance, the controller 190 of the thermal processing system 100 can determine expiration of a time interval (e.g., the time interval 420A described with reference to FIG. 10), such as a time interval in a range of about 5 milliseconds to about 100 milliseconds.

Moreover, at (606), the method 600 can include upon expiration of the time interval, controlling the heat source to stop heating the workpiece. For instance, the controller 190 of the thermal processing system 100 can control the heat source(s) 150 to stop heating (i.e., emitting light towards) the workpiece 120 when the time interval expires.

Additionally, at (608), the method 600 can include controlling a cooling system to begin flowing a cooling gas at a rate of about 300 slm or greater over the workpiece based at least in part on the time interval expiring. For instance, when the time interval expires, the controller 190 can control a cooling system 200 of the thermal processing system begin flowing a cooling gas at a rate of about 300 slm or greater over the workpiece 120 to reduce a t50 peak width of the workpiece.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing system for performing rapid thermal processing of semiconductor workpieces, comprising: a processing chamber; a workpiece support configured to support a workpiece within the processing chamber; a heat source configured to heat the workpiece; a temperature measurement system configured to generate data indicative of a temperature of the workpiece; a cooling system configured to flow a cooling gas over the workpiece supported on the workpiece support, and comprising:
   a distribution plate positioned co-axially with the workpiece support, the distribution plate having a surface parallel to the workpiece support, wherein an axis of the distribution plate is at the center of the distribution plate, the distribution plate having a plurality of holes extending axially therethrough, each of the plurality of holes of the distribution plate being at a different radial distance from a center of the distribution plate: wherein the plurality of holes comprises a first hole which extends along a first radial distance away from the axis and a second hole which extends along a second radial distance, wherein the first radial distance is greater than the second radial distance away from the axis, and wherein the first hole is larger than the second hole; and
   a controller configured to control the heat source and the cooling system based at least in part on the data indicative of the temperature of the workpiece to provide a flow of cooling gas into the processing chamber at a rate of about 300 slm or greater to reduce a t50 peak width of a workpiece during a thermal process.

2. The system of claim 1, wherein the cooling system further comprises:
   a cover plate positioned axially adjacent the distribution plate, opposite the workpiece support;
   a collar coupled axially between the distribution plate and the cover plate, the collar, the distribution plate, and the cover plate together defining an interior chamber; and
   a gas supply coupled to the collar to provide the cooling gas from a gas source to the interior chamber,
   wherein the controller is configured to control the gas supply of the cooling system during a spike anneal thermal process.

3. The system of claim 1, wherein each of the plurality of holes has a same cross-sectional area.

4. The system of claim 3, wherein the plurality of holes are increasingly elongated along the radial direction with decreasing radial distance from the center of the distribution plate such that each of the plurality of holes extends along a same azimuthal distance.

5. The system of claim 2, wherein the gas supply comprises an inlet plate coupled to and extending along an azimuthal direction between first and second ends of the collar spaced apart by a gap distance, the inlet plate comprising a plurality of inlet openings spaced apart along the azimuthal direction.

6. The system of claim 5, wherein the gas supply further comprises a plurality of inlet tubes, each of the plurality of inlet tubes connecting a respective one of the plurality of inlet openings to the gas source.

7. The system of claim 5, wherein the gas supply further comprises a baffle plate extending along at least part of the gap distance and spaced radially inwardly from the inlet plate, the baffle plate having a plurality of diffusing openings.

8. The system of claim 7, wherein the plurality of diffusing openings of the baffle plate and the plurality of inlet openings of the inlet plate are spaced apart along the azimuthal direction, and
   wherein the plurality of diffusing openings of the baffle plate and the plurality of inlet openings of the inlet plate alternate along the azimuthal direction.

9. The system of claim 2, wherein the cover plate, the distribution plate, the collar, and the gas supply are comprised of quartz material.

10. The thermal processing system of claim 1, wherein the plurality of holes spiral outwardly from the first hole to the second hole.

11. A thermal processing system for performing rapid thermal processing of semiconductor workpieces, comprising: a processing chamber; a workpiece support configured to support a workpiece within the processing chamber; a heat source configured to heat the workpiece; a temperature measurement system configured to generate data indicative of a temperature of the workpiece; a cooling system configured to flow a cooling gas over the workpiece supported on the workpiece support, comprising:
   a distribution plate positioned axially adjacent the workpiece support, the distribution plate having a surface parallel to the workpiece support, the distribution plate having a plurality of holes extending axially therethrough, a cover plate positioned axially adjacent the distribution plate, opposite the workpiece support, wherein the plurality of holes comprises a first hole which extends along a first radial distance away from the axis and a second hole which extends along a second radial distance, wherein the first radial distance is greater than the second radial distance away from the axis, and wherein the first hole is larger than the second hole;
   a collar coupled axially between the distribution plate and the cover plate, the collar, the distribution plate, and the cover plate together defining an interior chamber; and
   a gas supply coupled to the collar to provide the cooling gas from a gas source to the interior chamber, the gas supply comprising a plurality of inlet openings and a plurality of tubes such that gas entering the interior chamber is divided to flow into the interior chamber from a plurality of different azimuthal positions.

\* \* \* \* \*